United States Patent [19]
Kawai

[11] Patent Number: 5,079,188
[45] Date of Patent: Jan. 7, 1992

[54] METHOD FOR THE PRODUCTION OF A SEMICONDUCTOR DEVICE

[75] Inventor: Masato Kawai, Tenri, Japan

[73] Assignee: Sharp Kabushiki Kaisha, Osaka, Japan

[21] Appl. No.: 300,440

[22] Filed: Jan. 23, 1989

[30] Foreign Application Priority Data

Jan. 21, 1988 [JP] Japan ................................ 63-11611

[51] Int. Cl.⁵ .......................................... H01L 21/44
[52] U.S. Cl. ................................. 437/195; 437/228; 437/231; 437/235; 156/661.1
[58] Field of Search ............... 437/235, 195, 231, 228, 437/435; 156/643, 646, 653, 661.1

[56] References Cited

U.S. PATENT DOCUMENTS

| | | | |
|---|---|---|---|
| 4,545,852 | 10/1985 | Barton | 437/228 |
| 4,654,113 | 3/1987 | Tuchiya et al. | 156/643 |
| 4,676,867 | 6/1987 | Elkins et al. | 156/643 |
| 4,775,550 | 10/1988 | Chu et al. | 437/225 |
| 4,826,786 | 5/1989 | Merenda et al. | 437/195 |

FOREIGN PATENT DOCUMENTS 0272949 12/1986 Japan .................................. 437/235

Primary Examiner—Brian E. Hearn
Assistant Examiner—Tuan Nguyen
Attorney, Agent, or Firm—Morrison & Foerster

[57] ABSTRACT

A method for the production of a semiconductor device in which wiring is formed in three dimensions by the use of interlevel insulators having a flat surface, which method comprises the steps of: applying first insulation material and hardening by heat treatment to form an insulating film made of the first material; etching the insulating film made of the first material in such a manner that only concave portions of an underlying layer are filled with an insulator made of the first material; and forming an insulating film made of a second material thereon, wherein the interlevel insulator is formed by repeating the steps for at least two times so as to have a plurality of the insulators made of the first material which are separated by the insulating films made of the second material.

3 Claims, 1 Drawing Sheet

METHOD FOR THE PRODUCTION OF A SEMICONDUCTOR DEVICE

BACKGROUND OF THE INVENTION

1. Field of the Invention

This invention relates to a method for the production of a semiconductor device and more particularly to an improved process for the formation of an interlevel insulator which flattens surface irregularities over the semiconductor substrate of the device.

2. Description of the Prior Art

In order to improve the degrees of density and integration of semiconductor devices, it is essential to form its wiring in three dimensions. The wiring in three dimensions may give rise to surface irregularities over the semiconductor substrate of the device, which irregularities will cause disconnection and/or electrical short circuiting of the wiring, thereby decreasing the production yield of the device. For the purpose of solving these problems,, it is desirable to flatten the surface of an insulating film which is formed on a conductive film used for lower wiring. The conventional method commonly used for this purpose at the present time includes the steps of: applying organic silanol glass, so that the concave portions of the insulating film which is formed on the conductive film are filled therewith; and hardening the organic silanol glass by the application of heat to form an insulating film made of organic silanol glass, so that the surface irregularities of the insulating film formed on the conductive film are flattened.

In the above-mentioned conventional method, because single application of organic silanol glass cannot provide satisfactory flatness, the flat surface of the insulating film formed on the conductive film has been attained by several applications of organic silanol glass. However, a thick insulating film made of organic silanol glass gives rise to a crack 9 as shown in FIG. 2, thereby causing insulation failure.

If the number of applications of organic silanol glass is decreased, satisfactory flatness cannot be obtained, so that there will occur disconnection 10 of the upper conductive film 8 as shown in FIG. 3.

Moreover, when after the insulating film 4 made of organic silanol glass is formed and the surface irregularities are flattened, the interlevel insulator, which comprises the insulating film 4 made of organic silanol glass and other insulating films 3 and 5, is provided with a through-hole 11, etc., followed by formation of the upper conductive film 8 to connect electrically with the lower conductive film 2, some gases such as $O_2$ and $H_2O$ are generated in the insulating film 4 made of organic silanol glass and diffuse into the upper conductive film 8 through a certain portion of the insulating film made of organic silanol glass, which portion is exposed to the side wall of the through-hole 11. These gases react with metal materials used for wiring to form metal oxides. As a result, the connection resistance between the lower conductive film 2 and the upper conductive film 8 increases, so that their electrical connection becomes unstable, thereby causing difficulties in producing high-speed semiconductor devices.

SUMMARY OF THE INVENTION

The method for the production of a semiconductor device, which overcomes the above-discussed and numerous other disadvantages and deficiencies of the prior art, comprises the steps of: applying first insulation material and hardening by heat treatment to form an insulating film made of the first material; etching the insulating film made of the first material in such a manner that only concave portions of an underlying layer are filled with an insulator made of the first material; and forming an insulating film made of a second material thereon, wherein the interlevel insulator is formed by repeating the steps for at least two times so as to have a plurality of the insulators made of the first, material which are separated by the insulating films made of the second material.

In a preferred embodiment, the first material is organic silanol glass.

In a preferred embodiment, the insulating film made of the second material is formed by chemical vapor deposition.

Thus, the invention described herein makes possible the objectives of (1) providing a method for the production of a semiconductor device, in which an interlevel insulator comprising a plurality of insulators made of organic silanol glass can be formed without cracks occurring in the insulators made of organic silanol glass, so that semiconductor devices having high degrees of density and integration can be produced with high reliability; and (2) providing a method for the production of a semiconductor device, in which conductive films used for upper and lower wiring can be connected stably with each other, so that there are no difficulties of producing high-speed semiconductor devices.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENT

As mentioned above, according to the method of this invention, the surface irregularities over the substrate of a semiconductor device can be flatten by an interlevel insulator comprising a plurality of insulators made of organic silanol glass, which insulators are separated by other insulating films such as those formed by chemical vapor deposition Thus, each of the insulators made of organic silanol glass can be made thin, so that it is possible to prevent the occurrence of cracks in these insulators made of organic silanol glass while attaining the desired flatness of the interlevel insulator Moreover, the portion of an insulating film made of organic silanol glass, which portion is positioned over the lower conductive film, is removed by an etching technique to form the insulator made of organic silanol glass. Therefore, there is no danger that the insulator made of organic silanol glass may be exposed at the side wall of through-holes, etc., which are formed on the lower conductive film.

The invention will be further illustrated by reference to the following examples along with the accompanying drawings, but these examples are not intended to limit the present invention in any sense

EXAMPLES

Figure 1:
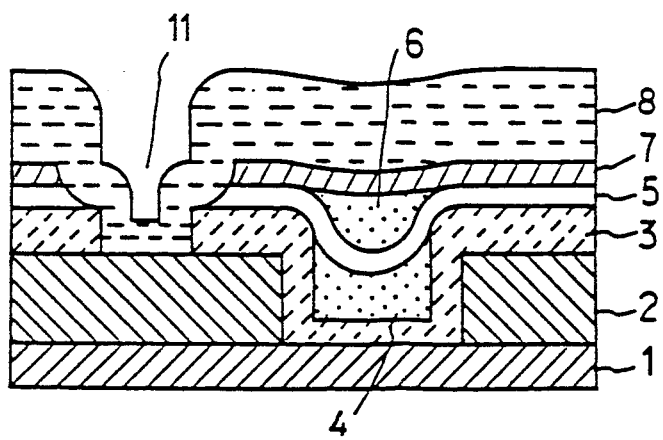
FIG. 1 is a partial, sectional view showing a semiconductor device produced according to the method of this invention.
Figure 2:
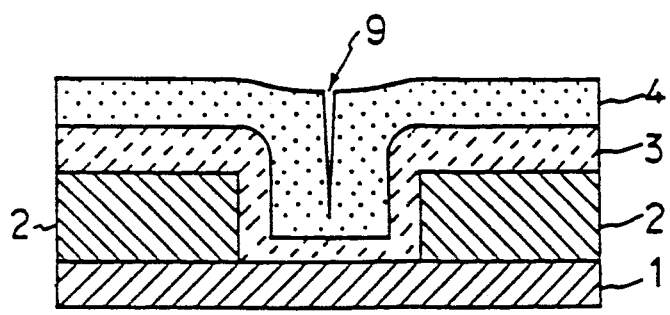
FIG. 2 is a partial, sectional view showing the occurrence of a crack in an insulating film made of organic silanol glass during the production of a semiconductor device according to the conventional method.
Figure 3:
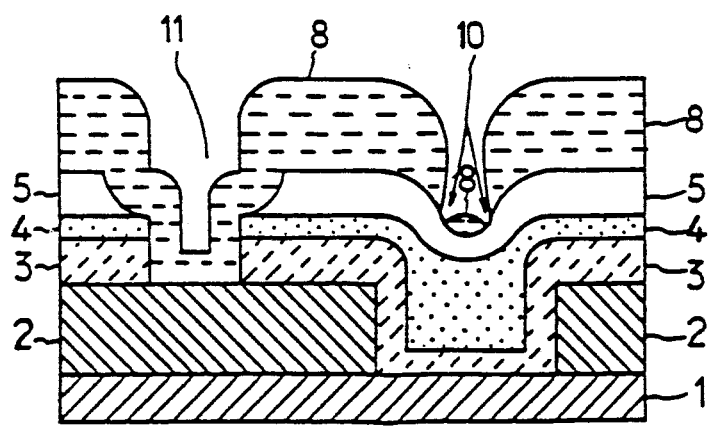
FIG. 3 is a partial, sectional view showing the occurrence of interconnection in an upper conductive film during the production of a semiconductor device according to the conventional method.

FIG. 1 shows a semiconductor substrate (not shown), an insulating film 1 is formed on which a lower conductive film 2 is then selectively formed to use for lower wiring, thereby raising the occurrence surface irregularities. After an insulating film 3 is deposited on the entire surface of the lower conductive film 2 including the insulating film 1, organic silanol glass is applied to the surface of the insulating film 3 and hardened by heat treatment, resulting in an insulating film made of organic silanol glass. The portion of the said insulating film made of organic silanol glass, which portion is positioned over the lower conductive film 2, is removed by an etching technique to form an insulator 4 made of organic silanol glass, and a chemical-vapor deposited (CVD) insulating film 3 is formed on the entire surface of the insulating film 3 including the insulator 4 made of organic silanol glass. Then, organic silanol glass is applied to the entire surface of the CVD insulating film 5 and hardened by heat treatment, resulting in an insulating film made of organic silanol glass. The portion of the said insulating film made of organic silanol glass, which portion is positioned over the lower conductive film 2, is removed by an etching technique to form an insulator 6 made of organic silanol glass, and a CVD insulating film 7 is formed on the entire surface of the CVD insulating film 5 including the insulator 6 made of organic silanol glass. Then, the insulating film 3 and the CVD insulating films 5 and 7, which constitute an interlevel insulator, are selectively removed by an etching technique to form a through-hole 11 positioned on the lower conductive film 2. Thereafter, an upper conductive layer 8 is formed to use for upper wiring on the entire surface of the interlevel insulator including the lower conductive film 2, so that the lower conductive film 2 and the upper conductive film 8 are electrically connected with each other via the through-hole 11.

Thus, the insulators 4 and 6 made of organic silanol glass are separated by the CVD insulating film 5, so that there will occur no cracks in these insulators made of organic silanol glass. Moreover, the insulators 4 and 6 made of organic silanol glass are not exposed at the side wall of the through-hole 11, so that the electrical connection between the upper conductive film 8 and the lower conductive film 2 in the through-hole 11 becomes stable.

In the above-mentioned example, the series of steps of applying organic silanol glass, etching an insulating film made of organic silanol glass, and forming a CVD insulating film are repeated two times, but this invention is not limited thereto. If satisfactory flatness of the interlevel insulator is obtained without cracks occurring in the insulators made of organic silanol glass, the above-mentioned series of the steps can be repeated many times.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

I claim:

1. A method for the production of a semiconductor device in which wiring is formed in three dimensions by the use of an interlevel insulator, which method comprises the steps of:

applying first insulation material and hardening by heat treatment to form an insulating film made of the first material;

etching said insulating film made of the first material in such a manner that only concave portions of an underlying layer are filled with an insulator made of the first material; and forming an insulating film made of a second material therein, wherein said interlevel insulator is formed by repeating said steps for at least two times so as to have a plurality of said insulators made of the first material which are separated by said insulating films made of the second material.

2. A method for the production of a semiconductor device according to claim 1, wherein said first material is organic silanol glass.

3. A method for the production of a semiconductor device according to claim 1, wherein said insulating film made of the second material is formed by chemical vapor deposition.

* * * * *